US011158987B2

(12) United States Patent
Monahan et al.

(10) Patent No.: US 11,158,987 B2
(45) Date of Patent: Oct. 26, 2021

(54) MULTIDIRECTIONAL LINECORD

(71) Applicant: International Business Machines Corporation, Armonk, NY (US)

(72) Inventors: Robert John Monahan, Rochester, MN (US); Sandra J. Shirk/Heath, Rochester, MN (US); Paul Schaefer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/735,157

(22) Filed: Jan. 6, 2020

(65) Prior Publication Data

US 2021/0210893 A1     Jul. 8, 2021

(51) Int. Cl.
*H01R 35/04* (2006.01)
*H01R 13/516* (2006.01)
*H01R 13/58* (2006.01)
*H01R 43/20* (2006.01)
*H05K 7/14* (2006.01)
*H01R 13/502* (2006.01)

(52) U.S. Cl.
CPC ........... *H01R 35/04* (2013.01); *H01R 13/516* (2013.01); *H01R 13/5845* (2013.01); *H01R 43/20* (2013.01); *H05K 7/1492* (2013.01); *H01R 13/502* (2013.01)

(58) Field of Classification Search
CPC ..................................................... H01R 35/04
See application file for complete search history.

(56) References Cited

U.S. PATENT DOCUMENTS

| 4,629,276 | A | 12/1986 | Genaro | |
|---|---|---|---|---|
| 5,211,706 | A | 5/1993 | Polgar | |
| 5,595,503 | A * | 1/1997 | Pittman | H01R 13/56 439/11 |
| 5,735,707 | A | 4/1998 | O'Groske | |
| 6,709,297 | B2 | 3/2004 | Lee | |
| 6,948,969 | B2 | 9/2005 | Huang | |
| 7,186,133 | B1 | 3/2007 | Szczesny | |
| 7,811,136 | B1 * | 10/2010 | Hsieh | H01R 35/04 439/640 |
| 8,133,060 | B2 * | 3/2012 | Wadsworth | H01R 35/02 439/21 |
| 8,371,872 | B2 * | 2/2013 | Zhou | H01R 35/02 439/446 |
| 8,777,671 | B2 * | 7/2014 | Huang | H01R 35/04 439/640 |
| 8,968,023 | B1 | 3/2015 | Walters | |
| 9,054,449 | B2 * | 6/2015 | Utz | H01R 13/5812 |
| 9,350,113 | B2 | 5/2016 | Garner | |
| 2010/0151732 | A1 * | 6/2010 | Xu | H01R 13/5808 439/607.45 |

FOREIGN PATENT DOCUMENTS

EP     0818854 A1     1/1998

OTHER PUBLICATIONS

"Right Angle Anglissimo Plugs," LEMO.com, Nov. 2016, 2 pages. <https://www.lemo.com/catalog/ROW/UK_English/Anglissimo_right_angle_plug.pdf>.

* cited by examiner

*Primary Examiner* — Ross N Gushi
(74) *Attorney, Agent, or Firm* — Grant M. McNeilly

(57) ABSTRACT

An electrical cord includes a housing with a cavity and a connector rotatably connected to the housing. The electrical cord also includes a strain reliever connected to the housing and a cable connected to the connector. The cable extends through the cavity and connects to the strain reliever.

19 Claims, 6 Drawing Sheets

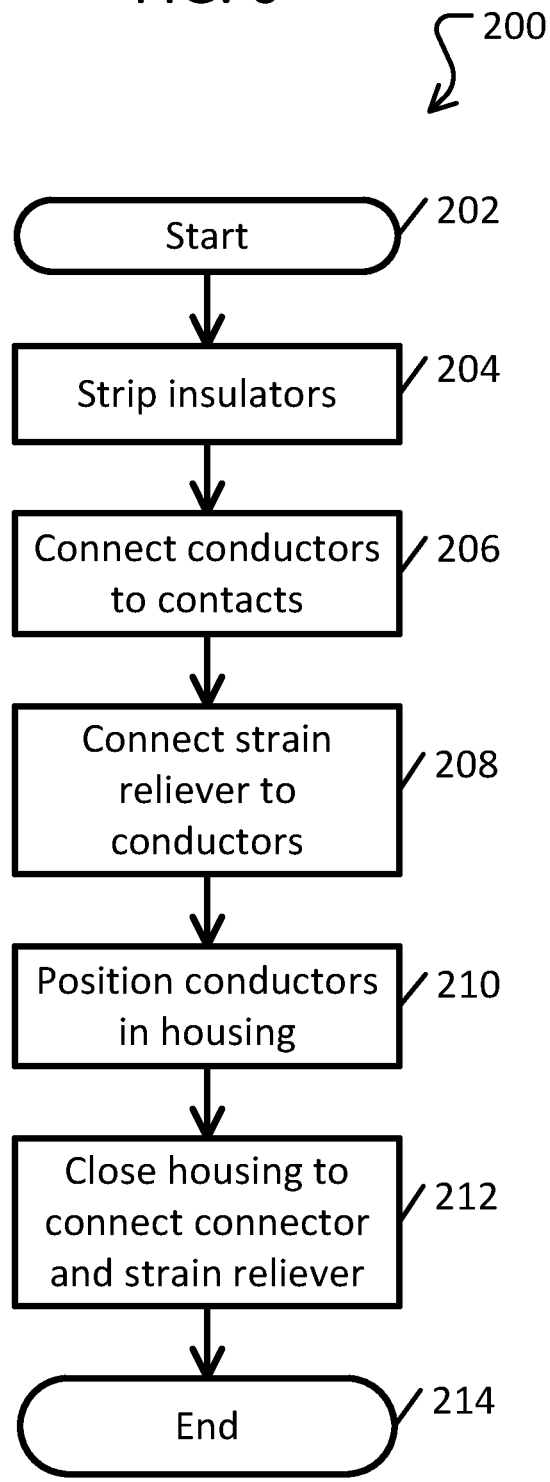

MULTIDIRECTIONAL LINECORD

BACKGROUND

The present invention relates to electrical cables, and more specifically, to rotatable connectors for electrical cables.

Electrical and/or electronic (generically "electric") device cables can be positioned near other objects (e.g., walls), for example, to conserve space. In addition, the location of the ports for plugging in the electrical devices can be proximate to other objects. In such a situation, a particularly-oriented electrical cord can be selected to match the space constraints of a given implementation. However, that particularly-oriented electrical cord may not be usable when the electric device is installed in another implementation, so a differently-oriented cord can be used for that implementation. Since there can be many different implementations, maintaining a supply of multiple different electrical cords can create logistical issues for an entity tasked with installing and maintaining the electric devices.

SUMMARY

According to some embodiments of the present disclosure, an electrical cord includes a housing with a cavity and a connector rotatably connected to the housing. The electrical cord also includes a strain reliever connected to the housing and a cable connected to the connector. The cable extends through the cavity and connects to the strain reliever.

According to some embodiments of the present disclosure, a method of making an electrical cord includes stripping an end portion of a jacket of bulk wire to expose a first conductor and a second conductor, connecting the first conductor to a first contact of a connector, connecting the second conductor to a second contact of a connector, and connecting a strain reliever to the first conductor and the second conductor. The method further includes connecting the connector to a housing so that the connector can rotate with respect to the housing and connecting the strain reliever to the housing. The first conductor and the second conductor are positioned in a cavity in the housing when the connector and the strain reliever are connected to the housing.

According to some embodiments of the present disclosure, a server room includes a power outlet, a server, and an electrical cord connected to the server and to the power outlet. The electrical cord has a connector that is rotatable between a first position and a second position. The first position is for connecting to the power outlet if the power outlet is located in a ceiling of the server room, and the second position is for connecting to the power outlet if the power outlet is located in a floor of the server room.

BRIEF DESCRIPTION OF THE DRAWINGS

FIG. 6 is a flowchart of a method of making an electrical cord, according to an embodiment of the present disclosure.

DETAILED DESCRIPTION

Figure 1:
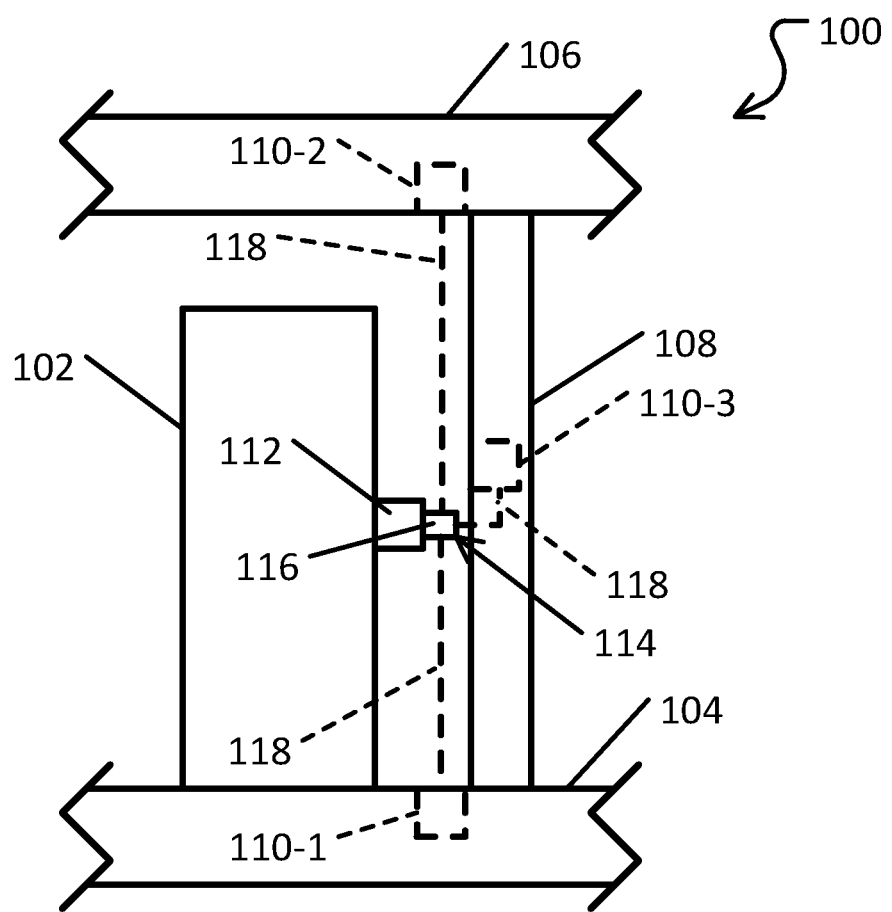
FIG. 1 is schematic view of a server room including an electric device, according to an embodiment of the present disclosure.

FIG. 1 is schematic view of server room 100 including electric device 102, according to an embodiment of the present disclosure. Server room 100 includes floor 104, ceiling 106, and wall 108. Floor 104 may include power source 110-1, ceiling 106 may include power source 110-2, and/or wall 108 may include power source 110-3 (collectively, "power sources 110"). In a typical embodiment, only one of power sources 110 will be present, which is why power sources 110 are shown in phantom. But in some embodiments, there are multiple power sources 110, although electric device 102 can be connected to only one of them.

Electric device 102 includes port 112, and electrical cord 114 electrically connects electric device 102 to one of power sources 110. More specifically, cord end 116 of electrical cord 114 is connected to port 112, and bulk wire 118 of electrical cord 114 is connected to one of power sources 110. For reasons similar to the depictions of power sources 110, bulk wire 118 is shown in phantom to each power source 110.

Figure 2:
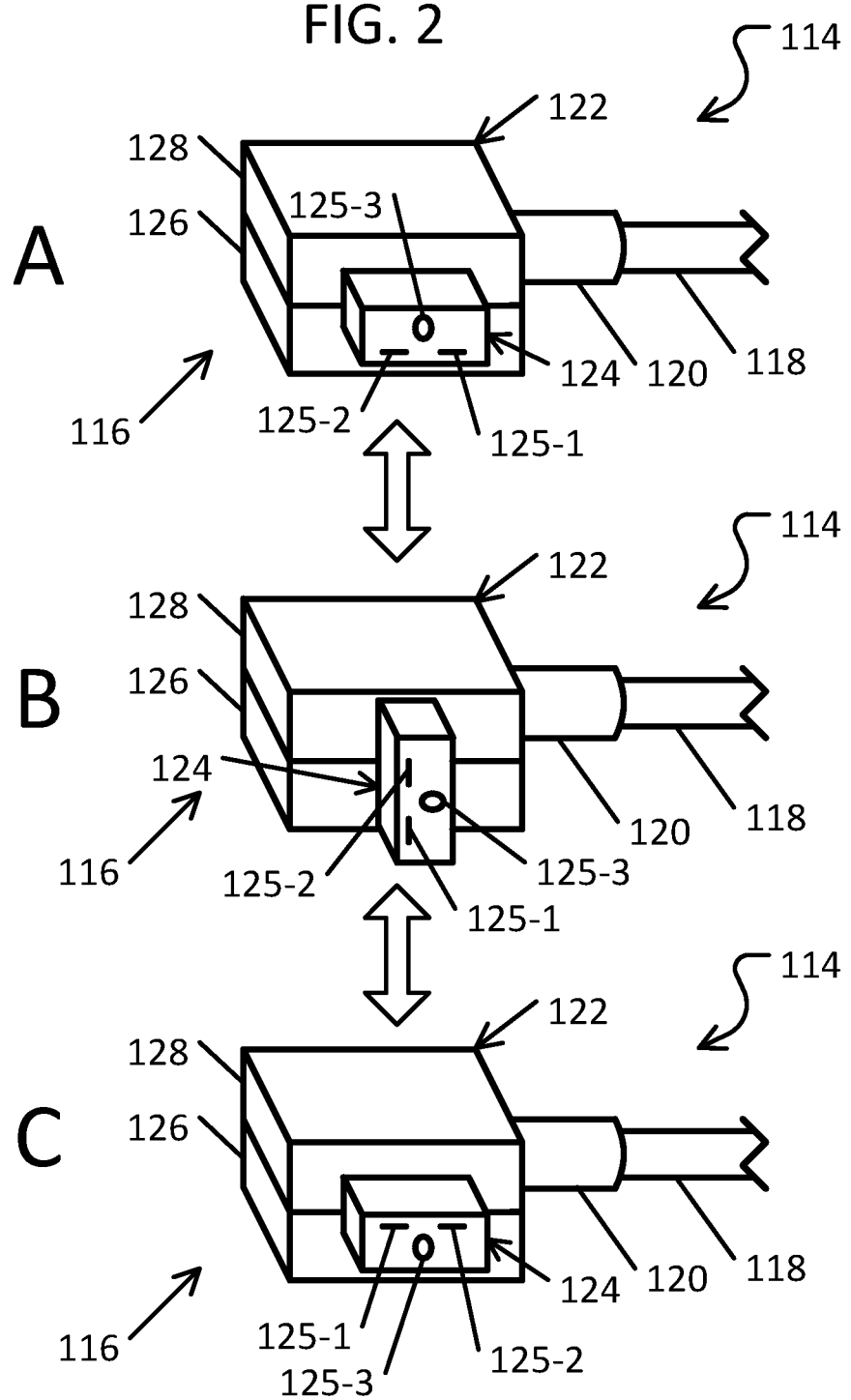
FIG. 2 is a series of perspective views of an electrical cord in multiple positions, according to an embodiment of the present disclosure.

FIG. 2 is a series of perspective views of electrical cord 114 in multiple positions A, B, and C, according to an embodiment of the present disclosure. Electrical cord 114 includes bulk wire 118 (e.g., a single cable that includes multiple insulated conductors to provide multiple channels of power, ground, and/or communication) and cord end 116 which is connected to bulk wire 118.

In the illustrated embodiment, cord end 116 includes strain reliever 120, housing 122, and connector 124. Strain reliever 120 is connected to bulk wire 118 and housing 122. Housing 122 is comprised of two portions 126 and 128 that are connected to each other, for example, by adhesive and/or a snap fit (not shown). In addition, housing 122 is rotatably connected to connector 124.

Thereby, connector 124 can be positioned and repositioned with respect to housing 122 to alter the orientations of contacts 125-1, 125-2, and 125-3. For example, in position A, connector 124 can be connected with port 112 (shown in FIG. 1) to provide power to electric device 102 (shown in FIG. 1) from power source 110-1. For another example, in position B (which is 90 degrees from position A), connector 124 can be connected with port 112 (shown in FIG. 1) to provide power to electric device 102 (shown in FIG. 1) from power source 110-3. For another example, in position C (which is 90 degrees from position B), connector 124 can be connected with port 112 (shown in FIG. 1) to provide power to electric device 102 (shown in FIG. 1) from power source 110-2. Thereby, power can be provided through electrical cord 114 despite port 112 of electric device 102 being positioned substantially close to wall 108.

Figure 3:
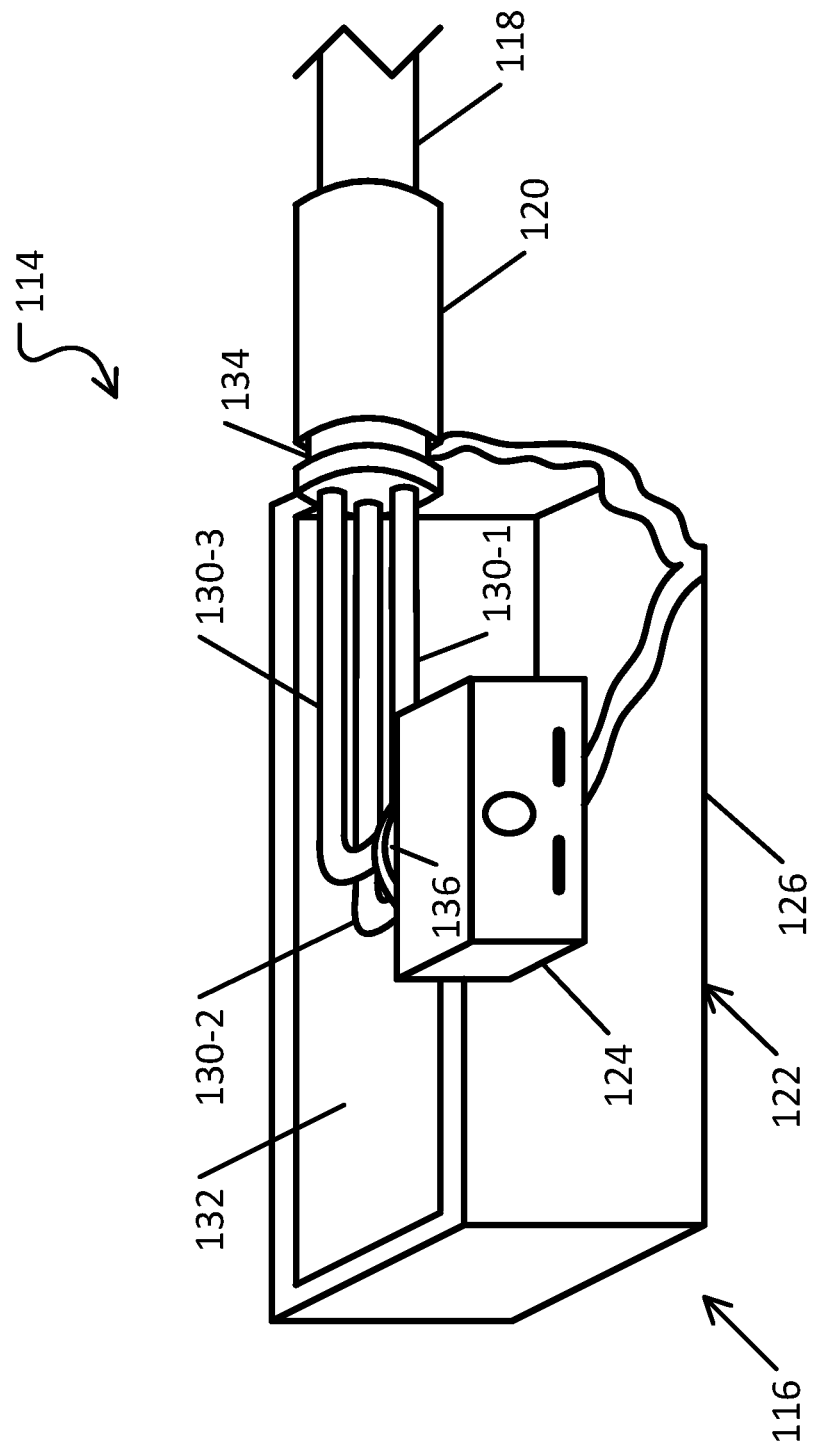
FIG. 3 is a perspective view of an electrical cord with a portion of a housing missing and the other half having a broken-out section, according to an embodiment of the present disclosure.

FIG. 3 is a perspective view of electrical cord 114 with portion 128 missing (shown in FIG. 2) and portion 126 having a broken-out section, according to an embodiment of the present disclosure. In this view, conductors 130-1, 130-2, and 130-3 (collectively, "conductors 130") are visible within housing 122 as the exterior jacket of bulk wire 118 does not extend beyond strain reliever 120. Housing 122 includes cavity 132 which is bordered by the interiors of portions 126 and 128 (shown in FIG. 2). Conductors 130 extend through cavity 132 from strain reliever 120 to connector 124. While three conductors 130 are present, in other embodiments, there are greater or fewer numbers of conductors 130.

In the illustrated embodiment, strain reliever includes groove 134 and connector 124 includes groove 136. There are also corresponding semicircular reliefs (shown in FIG. 5) in portions 126 and 128 that fit into grooves 134 and 136 when housing 122 is assembled to surround and capture strain reliever 120 and connector 124, respectively. The fit of connector 124 is loose enough to allow relative rotation between connector 124 and housing 122. In some embodiments, the fit of strain reliever 120 is tight enough to prevent relative rotation between strain reliever 124 and housing 122, although in other embodiments, the fit of strain reliever 120 is loose enough to allow relative rotation therebetween.

Thereby, connector 124 can rotate between positions A, B, and C (shown in FIG. 2) to accommodate utilization with different power sources 110 (shown in FIG. 1). In the illustrated embodiment, connector 124 is in position A, which can be the neutral position wherein conductors 130 run parallel to one another. But when connector 124 is rotated to positions B and C, conductors 130 can twist and cross over one another to accommodate the rotation. This is possible because of the space provided by cavity 132 and because the exterior jacket of bulk wire 118 has been removed from the portions of conductors 130 that are positioned in cavity 132. In other embodiments, the neutral position is position B or position C, or another position of connector 124.

Figure 4:
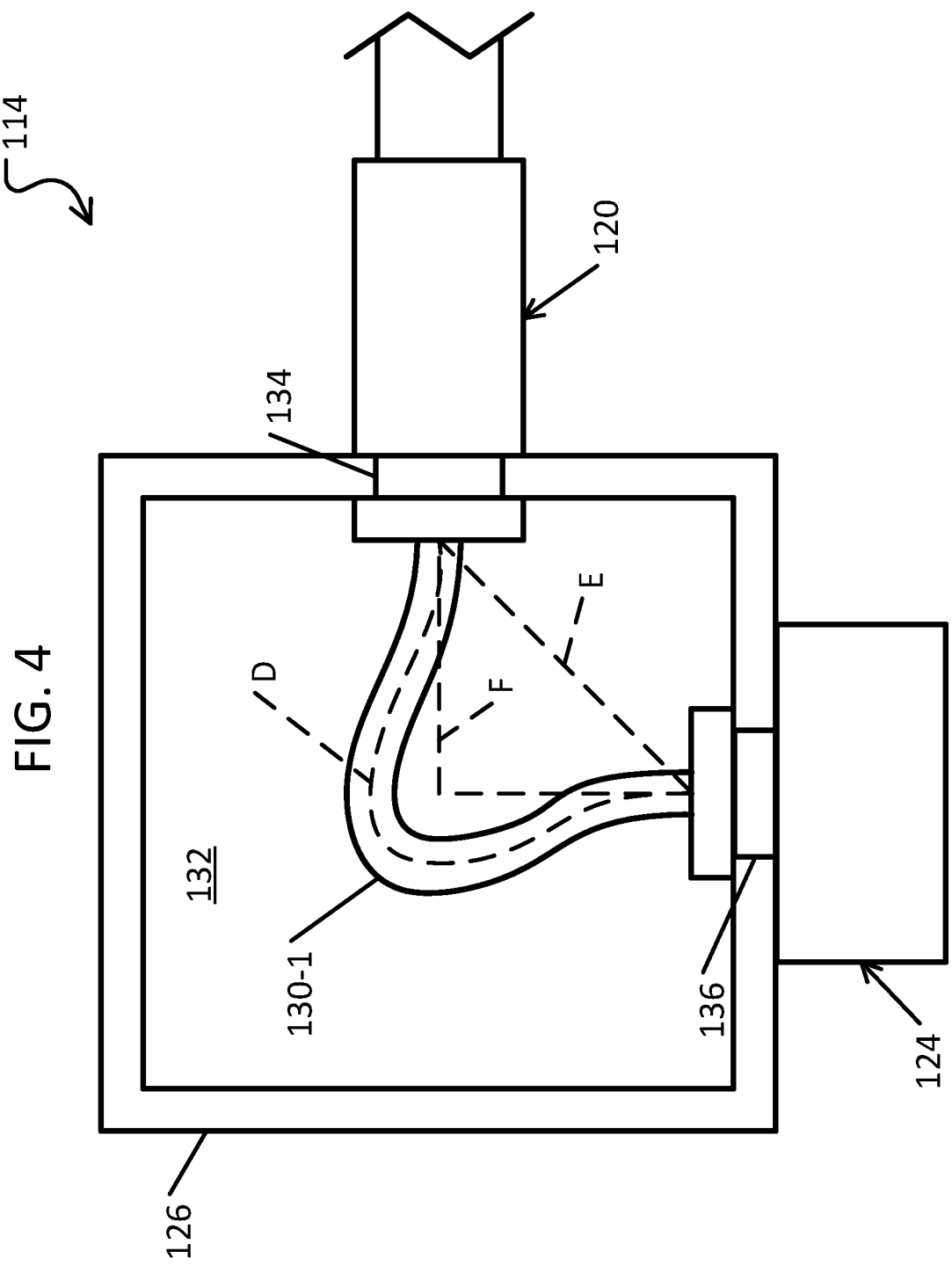
FIG. 4 is a top view of an electrical cord with a portion of a housing removed, according to an embodiment of the present disclosure.

FIG. 4 is a top view of electrical cord 114 with portion 128 missing (shown in FIG. 2), according to an embodiment of the present disclosure. For the sake of simplicity, only one conductor 130 is shown (specifically, conductor 130-1).

To compensate for the twisting of conductors 130 around each other during rotation of connector 124, length D of conductors 130 that are in cavity 132 can be longer than would otherwise be necessary to traverse distance E between strain reliever 120 and connector 124. In some embodiments, conductors 130 can be longer than a right-angle distance F between strain reliever 120 and connector 124. For example, length D can be at least 1.5 times distance E. For another example, length D can be between 1.8 and 2.2 times distance E. While the relative dimensions are shown with respect to conductor 130-1, other conductors 130 can have the same length D. In other embodiments, a calculation of distance E and length D can occur for each conductor 130. In addition, the ratio of distance E to length D can be the same for each conductor 130, or it can be altered based on, for example, the material and/or diameter of each conductor 130 and/or the neutral position of connector 124.

Figure 5:
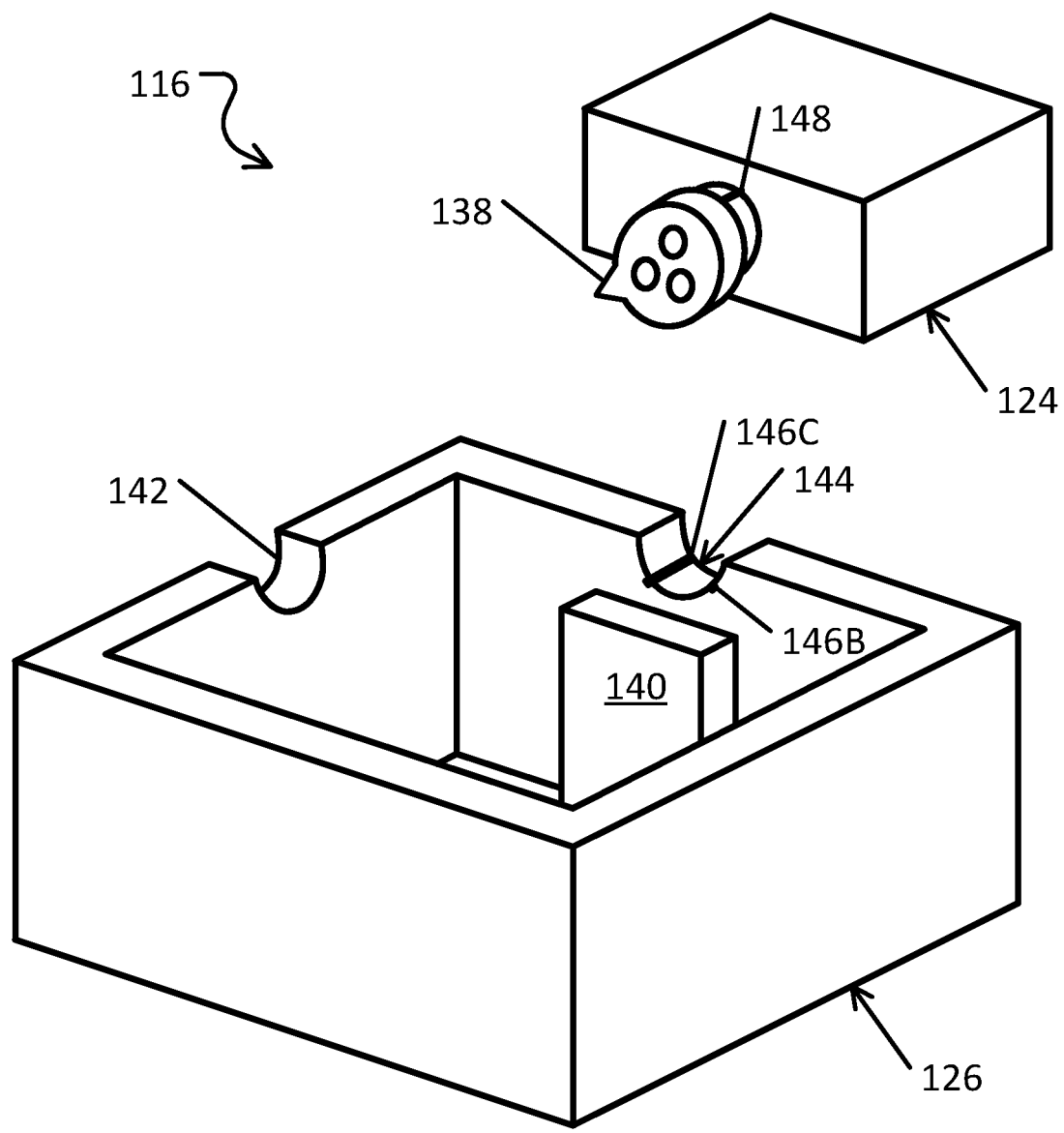
FIG. 5 is an exploded view of some of a cord end, according to an embodiment of the present disclosure.

FIG. 5 is an exploded view of some of cord end 116, according to an embodiment of the present disclosure. More specifically, connector 124 and housing portion 126 are shown with other components and features of cord end 116 absent for the sake of simplicity.

In the illustrated embodiment, connector 124 includes lug 138 and portion 126 includes stop 140. Lug 138 and portion 126 limits connector 124 from rotating a full 360 degrees, which prevents excessive twisting of conductors 130 (shown in FIG. 3) which could damage cord end 116. The freedom of rotation of connector 124 can be determined, for example, by the height and width of stop 140, by the height and width of lug 138, and the presence of multiple lugs 138 (although only one is shown in FIG. 5). In some embodiments, the range of rotation of connector 124 is 270 degrees, but in other embodiments, the range of rotation of connector 124 is 180 degrees.

Also shown in FIG. 5 are reliefs 142 and 144. Relief 142 is configured to interface with strain reliever 120 (shown in FIG. 4), and relief 144 is configured to interface with connector 124. In the illustrated embodiment, relief 144 includes notches 146B and 146C, and connector includes detent 148 to interface with notches 146B and 146C (collectively, "notches 146"). Detent 148 can be a strip of elastomeric material that can expand in notch 146B when connector 124 is in position B (shown in FIG. 2), and detent 148 can expand in notch 146C when connector 124 is in position C (shown in FIG. 2). (The corresponding relief in portion 128 could include a notch that would correspond to detent 148 when connector 124 would be in position A, shown in FIG. 2, although portion 128 is not included in FIG. 5 so such a notch is not depicted.) Since detent 148 is compressed when connector 124 is rotated out of a corresponding position of a notch 146, detent 148 inhibits rotation of connector 124 from such positions. Thereby, connector 124 tends to remain stationary when configured in a position where detent 148 fits into a notch 146.

While one embodiment of cord end 116 is depicted in FIG. 5, other embodiments are possible as well. For example, there can be greater or fewer notches 146. For another example, detent 148 can have a spring-and-ball configuration. For another example, detent 148 can be positioned on an axial face (instead of a circumferential face) of connector 124. In such embodiments, notches 146 would also be positioned on an axial face of portion 126.

FIG. 6 is a flowchart of method 200 of making electrical cord 114, according to an embodiment of the present disclosure. During the discussion of method 200, references may be made to the components and features described with respect to FIGS. 1-5. Method 200 starts at block 202.

At block 204, the exterior insulating sheath of bulk wire 118 is stripped to expose conductors 130, and the insulating sheath at the ends of conductors 130 can also be stripped, although appropriate lengths of insulating sheath is left on conductors 130 (e.g., at least length D) so that conductors 130 are electrically insulated from one another in housing 122. At block 206, conductors 130 are connected to connector 124, and conductor 130-1 is electrically connected to contact 125-1, conductor 130-2 is electrically connected to contact 125-2, and conductor 130-3 is electrically connected to contact 125-3. In some embodiments, contacts 125 are soldered to conductors 130, respectively, and connector 124 is overmolded onto contacts 125 and conductors 130.

At block 208, strain reliever 120 is connected to conductors 130 and/or bulk wire 118, depending on where the insulating sheath of bulk wire 118 ends. In some embodiments, this connection is made by overmolding strain reliever 120 around a portion of conductors 130 and a portion of bulk wire 118. At block 210, strain reliever 120 is positioned in relief 142 and connector 124 is positioned in relief 144 in housing portion 126 such that conductors 130 are positioned in cavity 132.

At block 212, housing portion 128 is connected to housing portion 126 to complete housing 122, capturing strain reliever 120 and connector 124 and enclosing conductors 130. At block 214, method 200 ends.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrical cord comprising:
a housing with a cavity bordered by a plurality of sides;
a connector rotatably connected to a first side of the plurality of sides of the housing;
a strain reliever connected to a second side of the plurality of sides of the housing;
a first cable connected to the connector, the first cable extending through the cavity and connected to the strain reliever;
a second cable connected to the connector, the second cable extending through the cavity and connected to the strain reliever;
a first detent feature to inhibit rotation of the connector from a first position;
a second detent feature to inhibit rotation of the connector from a second position; and
a third detent feature to inhibit rotation of the connector from a third position;
wherein the first side is adjacent to the second side;
wherein the third position is located between the first position and the second position;
wherein the first cable and the second cable are parallel when the connector is in the first position; and
wherein the first cable and the second cable are twisted when the connector is in the second position.

2. The electrical cord of claim 1, wherein a length of the first cable that is located in the cavity is at least 1.5 times a distance between where the cable connects to the connector and where the cable connects to the strain reliever.

3. The electrical cord of claim 2, wherein the length of the first cable that is located in the cavity is between 1.8 and 2.2 times the distance between where the cable connects to the connector and where the cable connects to the strain reliever.

4. The electrical cord of claim 1, wherein the housing comprises:
a first portion; and
a second portion;
wherein the housing surrounds a section of the connector when the first portion and the second portion are connected together.

5. The electrical cord of claim 1, wherein the housing comprises:
a first portion; and
a second portion;
wherein the housing surrounds a section of the strain reliever when the first portion and the second portion are connected together.

6. The electrical cord of claim 1, further comprising:
an anti-rotation feature connected to the housing that limits rotation of the connector to less than 360 degrees with respect to the housing.

7. The electrical cord of claim 6, wherein:
the connector can rotate at least 180 degrees with respect to the housing; and
the anti-rotation feature allows the connector to be rotatable through 270 degrees of rotation with respect to the housing.

8. The electrical cord of claim 1,
wherein the first detent feature and the second detent feature are positioned on a circumferential surface of the second side.

9. The electrical cord of claim 1, wherein the strain reliever is rotatably connected to the housing.

10. A method of making an electrical cord comprising:
stripping an end portion of a jacket of bulk wire to expose a first conductor and a second conductor;
connecting the first conductor to a first contact of a connector;
connecting the second conductor to a second contact of a connector;
connecting a strain reliever to the first conductor and the second conductor;
connecting the connector to a housing so that the connector can rotate with respect to the housing; and
connecting the strain reliever to the housing;
wherein the first conductor and the second conductor are positioned in a cavity in the housing when the connector and the strain reliever are connected to the housing;
wherein the first conductor and the second conductor are unjacketed from the strain reliever to the connector;
wherein the housing includes a first detent feature to inhibit rotation of the connector from a first position, a second detent feature to inhibit rotation of the connector from a second position, and a third detent feature to inhibit rotation of the connector from a third position;
wherein the third position is located between the first position and the second position;
wherein the first conductor and the second conductor are parallel when the connector is in the first position; and
wherein the first conductor and the second conductor are twisted when the connector is in the second position.

11. The method of claim 10, wherein the connector is limited in rotation to less than 360 degrees with respect to the housing.

12. The method of claim 11, wherein the connector can rotate at least 180 degrees with respect to the housing.

13. The method of claim 10, wherein connecting a strain reliever to the first conductor and the second conductor comprises overmolding a strain reliever around the first conductor and the second conductor.

14. The method of claim 10, wherein connecting the connector to a housing so that the connector can rotate with respect to the housing comprises connecting a first portion of the housing to a second portion of the housing to surround a section of the connector.

15. A server room comprising:
a power outlet;
a server; and
an electrical cord connected to the server and to the power outlet, the electrical cord comprising:
a connector that is rotatable between a first position and a second position;
a housing with a cavity, wherein the housing is rotatably connected to the connector;
a strain reliever rotatably connected to the housing; and
a first cable connected to the connector, the first cable extending through the cavity and connected to the strain reliever;
wherein the first position is for connecting to the power outlet if the power outlet is located in a ceiling of the server room, and the second position is for connecting to the power outlet if the power outlet is located in a floor of the server room.

16. The server room of claim 15, wherein the first position is 180 degrees from the second position, and the connector is rotatable through 270 degrees of rotation.

17. The server room of claim 15, wherein the electrical cord further comprises:
- a second cable connected to the connector, the second cable extending through the cavity and connected to the strain reliever.

18. The server room of claim 15, wherein the electrical cord further comprises:
- a first detent to inhibit rotation of the connector from the first position; and
- a second detent to inhibit rotation of the connector from the second position.

19. The server room of claim 15, wherein:
- the electrical cord further comprises a second cable connected to the connector, the second cable extending through the cavity and connected to the strain reliever; and
- the housing further comprises:
  - a first detent feature to inhibit rotation of the connector from a first position;
  - a second detent feature to inhibit rotation of the connector from a second position; and
  - a third detent feature to inhibit rotation of the connector from a third position;
  - wherein the third position is located between the first position and the second position;
  - wherein the first cable and the second cable are parallel when the connector is in the first position; and
  - wherein the first cable and the second cable are twisted when the connector is in the second position.

\* \* \* \* \*